(12) United States Patent
Lee et al.

(10) Patent No.: US 10,283,540 B2
(45) Date of Patent: May 7, 2019

(54) IMAGE SENSOR AND METHOD FOR FABRICATING THE SAME

(71) Applicant: Samsung Electronics Co., Ltd., Suwon-si (KR)

(72) Inventors: Yun Ki Lee, Seoul (KR); Min Wook Jung, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/857,695

(22) Filed: Dec. 29, 2017

(65) Prior Publication Data

US 2018/0190690 A1 Jul. 5, 2018

(30) Foreign Application Priority Data

Dec. 30, 2016 (KR) .................. 10-2016-0183315

(51) Int. Cl.
 *H01L 27/146* (2006.01)

(52) U.S. Cl.
 CPC ...... *H01L 27/1462* (2013.01); *H01L 27/1464* (2013.01); *H01L 27/14621* (2013.01); *H01L 27/14627* (2013.01); *H01L 27/14636* (2013.01); *H01L 27/14645* (2013.01); *H01L 27/14685* (2013.01); *H01L 27/14614* (2013.01)

(58) Field of Classification Search
 CPC ........... H01L 27/14614; H01L 27/1462; H01L 27/14621; H01L 27/14627; H01L 27/14636; H01L 27/1464; H01L 27/14645; H01L 27/14685
 See application file for complete search history.

(56) References Cited

U.S. PATENT DOCUMENTS

| | | |
|---|---|---|
| 6,617,189 B1 | 9/2003 | Chen et al. |
| 7,714,403 B2 | 5/2010 | Lee et al. |
| 9,006,807 B2 | 4/2015 | Inoue et al. |
| 9,252,180 B2 | 2/2016 | Chien et al. |
| 9,263,490 B2 | 2/2016 | Yanagita et al. |

(Continued)

FOREIGN PATENT DOCUMENTS

| | | |
|---|---|---|
| JP | 2011-014674 | 1/2011 |
| JP | 5696081 | 4/2015 |
| KR | 10-0801447 | 2/2008 |

*Primary Examiner* — Mohammed Shamsuzzaman
(74) *Attorney, Agent, or Firm* — Muir Patent Law, PLLC

(57) ABSTRACT

An image sensor is provided. The image sensor includes, a substrate including a light-receiving region and a pad region disposed around the light-receiving region, wherein the light-receiving region receives light to generate image data, a photoelectric conversion layer disposed on the light-receiving region of the substrate, an anti-reflection layer disposed on the photoelectric conversion layer and including a plurality of subsidiary anti-reflection layers, a microlens disposed on the anti-reflection layer, a delamination-preventing layer disposed on the pad region of the substrate, and a wiring layer disposed on the delamination-preventing layer, wherein a lowermost one of the subsidiary anti-reflection layers of the anti-reflection layer includes a first material composition and the delamination-preventing layer includes a second material composition different from the first material composition.

18 Claims, 12 Drawing Sheets

(56) References Cited

U.S. PATENT DOCUMENTS

| | | | |
|---|---|---|---|
| 9,324,755 B2* | 4/2016 | Borthakur | H01L 27/14623 |
| 2009/0166518 A1* | 7/2009 | Tay | H01L 27/14625 |
| | | | 250/227.11 |
| 2011/0006387 A1* | 1/2011 | Katsuno | H01L 27/14625 |
| | | | 257/433 |
| 2015/0214267 A1 | 7/2015 | Chen et al. | |
| 2016/0005781 A1* | 1/2016 | Lin | H01L 27/14643 |
| | | | 257/292 |
| 2016/0126267 A1 | 5/2016 | Barr et al. | |
| 2016/0233267 A1 | 8/2016 | Borthakur et al. | |
| 2016/0254306 A1 | 9/2016 | Chen et al. | |
| 2016/0316159 A1* | 10/2016 | Yoneda | H01L 27/14612 |
| 2017/0078606 A1* | 3/2017 | Ohmaru | H01L 27/14612 |
| 2018/0039882 A1* | 2/2018 | Ikeda | H01L 27/14609 |

\* cited by examiner

IMAGE SENSOR AND METHOD FOR FABRICATING THE SAME

This application claims priority under 35 U.S.C. § 119 to Korean Patent Application No. 10-2016-0183315 filed on Dec. 30, 2016, in the Korean Intellectual Property Office, the disclosure of which is incorporated herein by reference in its entirety.

BACKGROUND

1. Field of the Disclosure

The present disclosure relates to an image sensor and a method for fabricating the same. Specifically, the present disclosure relates to an image sensor including an anti-reflection layer, and a method for fabricating the same.

2. Description of the Related Art

An image sensor is a device that converts an optical image into an electric signal. Recently, as computer industry and communications industry evolve, there are growing demands for image sensors with improved performance in a variety of applications such as a digital camera, a camcorder, a personal communications system (PCS).

Image sensors include a charge coupled device (CCDs) and a CMOS image sensor. Among these, a CMOS image sensor is easy to drive and can incorporate its signal processing circuits into a single chip, such that it is possible to reduce the size of the product. In addition, a CMOS image sensor has a very low power consumption, making it easy to apply to products with limited battery capacity. Further, a CMOS image sensor can be manufactured by applying CMOS process technology, thereby reducing manufacturing cost. For these reasons, the CMOS image sensor is rapidly increasing in its use as it realized high resolution with the development of technology.

SUMMARY

An aspect of the present disclosure is to provide an image sensor with improved reliability.

Another aspect of the present disclosure is to provide a method for fabricating an image sensor with improved reliability.

According to aspects of the present disclosure, there is provided an image sensor comprising, a substrate comprising a light-receiving region and a pad region disposed around the light-receiving region, wherein the light-receiving region receives light to generate image data, a photoelectric conversion layer disposed in the light-receiving region of the substrate; an anti-reflection layer disposed on the photoelectric conversion layer and comprising a plurality of subsidiary anti-reflection layers; a microlens disposed on the anti-reflection layer; a delamination-preventing layer disposed in the pad region of the substrate; and a wiring layer disposed on the delamination-preventing layer, wherein a lowermost one of the subsidiary anti-reflection layers of the anti-reflection layer includes a first material composition and the delamination-preventing layer includes a second material composition different from the first material composition.

According to aspects of the present disclosure, there is provided an image sensor comprising, a substrate comprising a light-receiving region and a pad region disposed around the light-receiving region, wherein the light-receiving region receives light to generate image data, and the pad region comprises a recess; a photoelectric conversion layer disposed on the light-receiving region of the substrate; an anti-reflection layer disposed on the photoelectric conversion layer; a microlens disposed on the anti-reflection layer; a delamination-preventing layer disposed on the substrate of the pad region; a wiring layer disposed on the delamination-preventing layer on the recess; and a conductive pad disposed on the wiring layer and buried in the recess, wherein the anti-reflection layer includes a material not included in the delamination-preventing layer.

According to aspects of the present disclosure, there is provided an image sensor comprising, a photoelectric conversion layer disposed on a light-receiving region of a substrate, wherein the light-receiving region receives light to generate image data; an anti-reflection layer disposed on the photoelectric conversion layer; a microlens disposed on the anti-reflection layer; a delamination-preventing layer disposed on a pad region of the substrate; a wiring layer disposed on the delamination-preventing layer; and a conductive pad disposed on the wiring layer, wherein the anti-reflection layer includes material for preventing reflection of incident light and the delamination-preventing layer includes material for preventing delamination of the wiring layer.

This and other aspects, embodiments and advantages of the present disclosure will become immediately apparent to those of ordinary skill in the art upon review of the Detailed Description and Claims to follow.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
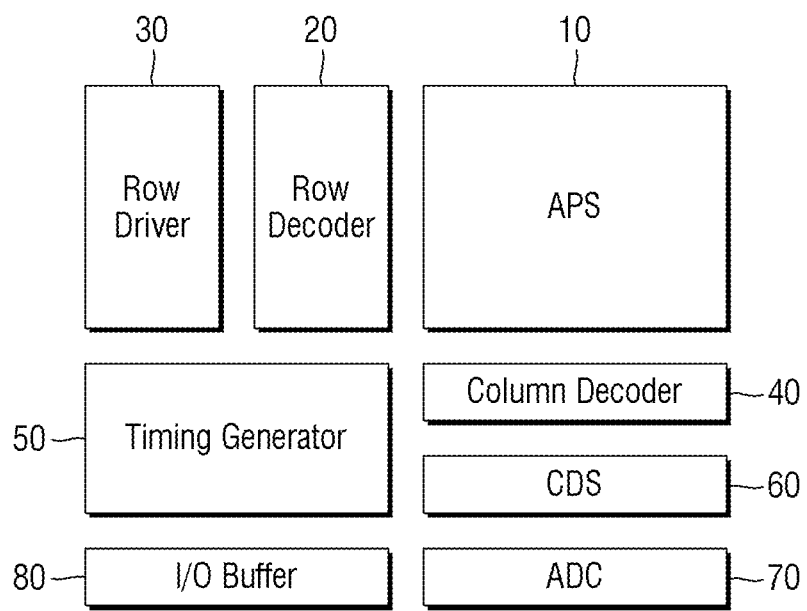
FIG. 1 is a block diagram of an image sensor according to some exemplary embodiments of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Hereinafter, an image sensor 1 according to some exemplary embodiments of the present disclosure will be described with reference to FIGS. 1 to 4.

FIG. 1 is a block diagram of an image sensor according to some exemplary embodiments of the present disclosure.

Referring to FIG. 1, the image sensor includes an active pixel sensor array 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 includes a plurality of unit pixels arranged in two-dimension, and converts an optical signal into an electrical signal. The active pixel sensor array 10 may be driven by a plurality of driving signals such as a pixel selection signal, a reset signal, and a charge transfer signal from the row driver 30. In addition, the electrical signal converted by the active pixel sensor array 10 is provided to the correlated double sampler 60.

The row driver 30 provides driving signals for driving the plurality of unit pixels to the active pixel sensor array 10 in response to the decoding by the row decoder 20. When the unit pixels are arranged in a matrix, driving signals may be provided row-by-row.

The timing generator 50 provides a timing signal and a control signal to the row decoder 20 and the column decoder 40.

The correlated double sampler (CDS) 60 receives an electrical signal generated in the active pixel sensor array 10 to hold and sample the electrical signal. The correlated double sampler 60 performs sampling by taking two samples of a certain noise level and the signal level of an electrical signal, and outputs a difference level corresponding to the difference between the noise level and the signal level.

The analog-to-digital converter (ADC) 70 converts the analog signal corresponding to the difference level output from the correlated double sampler 60 into a digital signal to output it.

The I/O buffer 80 latches digital signals, and the latched signal sequentially outputs digital signals to an image signal processing unit (not shown) in response to the decoding by the column decoder 40.

Figure 2:
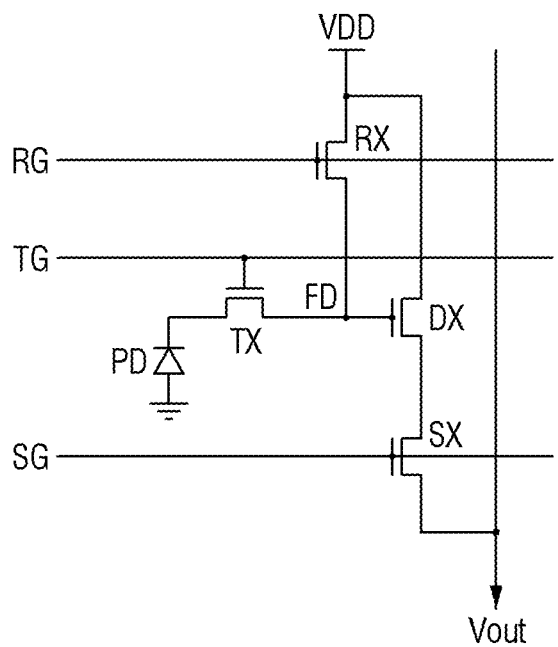
FIG. 2 is a circuit diagram of a unit pixel of an image sensor according to some exemplary embodiments of the present disclosure.

FIG. 2 is a circuit diagram of a unit pixel of an image sensor according to some exemplary embodiments of the present disclosure.

Referring to FIG. 2, the unit pixel includes a transistor TX and a plurality of logic transistors RX, SX and DX. The plurality of logic transistors may include a reset transistor (RX), a selection transistor (SX), and a drive transistor or a source follower transistor (DX).

The transfer transistor TX includes a photoelectric conversion unit PD, a floating diffusion region FD, and a transfer gate TG.

Although one transfer transistor TX is disposed in the unit pixel in FIG. 2, the technical idea of the present disclosure is not limited thereto. In some embodiments, more than one transfer transistors may be disposed in the unit pixel. For example, a plurality of photoelectric conversion units may be disposed in a unit pixel, and each of the plurality of photoelectric conversion units may include a transfer gate. In addition, for example, if a plurality of transfer transistors is disposed in a unit pixel, the floating diffusion region may be shared by them.

The photoelectric conversion unit PD may generate and accumulate photogenerated charges in proportion to the amount of light incident from the outside. The photoelectric conversion unit PD may include a photo diode, a photo transistor, a photo gate, a pinned photodiode (PPD) or a combination thereof.

The transfer gate TG transfers the charges accumulated in the photoelectric conversion unit PD to the floating diffusion region FD.

The floating diffusion region FD receives the charges generated in the photoelectric conversion unit PD and stores them accumulatively. The drive transistor DX may be controlled according to the amount of the photogenerated charges accumulated in the floating diffusion region FD.

The reset transistor RX may periodically reset the charges accumulated in the floating diffusion region FD. For example, the drain electrode of the reset transistor RX may be connected to the floating diffusion region FD and the source electrode thereof may be connected to a supply voltage VDD.

The reset transistor RX includes a reset gate RG and may be controlled by a reset signal. For example, when the reset transistor RX is turned on by the reset signal, the supply voltage VDD connected to the source electrode of the reset transistor RX is transferred to the floating diffusion region FD. Accordingly, when the reset transistor RX is turned on, the charges accumulated in the floating diffusion region FD are discharged, so that the floating diffusion region FD may be reset.

The drive transistor DX serves as a source follower buffer amplifier in cooperation with a constant current source (not shown) located outside the unit pixel. Accordingly, the drive transistor DX amplifies the potential change in the floating diffusion region FD to output it to an output line Vout.

The selection transistor SX may select a unit pixel to be read row-by-row. The selection transistor SX includes a selection gate SG and may be driven by a row selection signal. For example, when the selection transistor SX is turned on by the row selection signal, the supply voltage VDD connected to the drain electrode of the drive transistor DX may be transferred to the drain electrode of the selection transistor SX.

Figure 3:
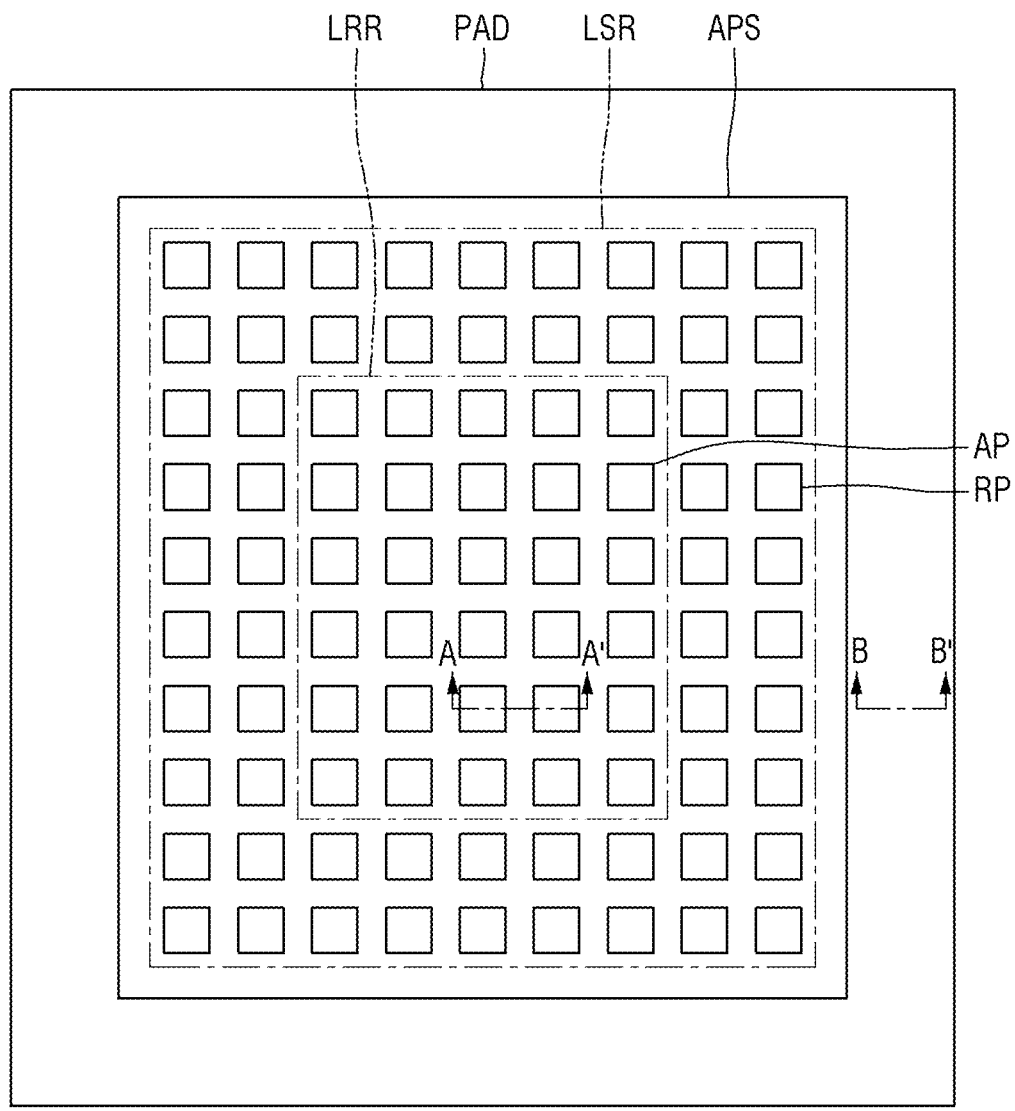
FIG. 3 is a plan view of an image sensor according to some exemplary embodiments of the present disclosure.

FIG. 3 is a view of an image sensor according to some exemplary embodiments of the present disclosure.

Referring to FIG. 3, an image sensor according to some exemplary embodiments includes an active pixel sensor array region APS and a pad region PAD.

The active pixel sensor array region in which unit pixels are arranged may include a light-receiving region (LRR) receiving light to generate image data, and a light-shielding region (LSR) not receiving light. For example, the light-shielding region LSR may be disposed between the light-receiving region LRR and the pad region PAD. However, the technical idea of the present disclosure is not limited thereto, and the light-receiving region LRR and the light-shielding region LSR may be arranged in various forms. In the exemplary embodiment illustrated in FIG. 3, the light-shielding region LSR may be disposed to surround the light-receiving region LRR.

A plurality of unit pixels arranged in a matrix is disposed in the active pixel sensor array region APS. In addition, in the active pixel sensor array region APS, an electric signal generated by an incident light is output.

For example, the unit pixels may include active pixels AP and reference pixels RP. The active pixels AP are disposed in the light-receiving region LRR, and may convert the incident light into electrical signals. The reference pixels RP are disposed in the light-shielding region LSR and may output electrical signals generated in unit pixels with no incident light.

The pad region PAD includes a conductive pad, e.g., a conductive pad 320 (see FIG. 4) used for inputting/outputting a control signal and a photoelectric signal from the active pixel sensor array region APS. The pad region PAD may be disposed around the light-receiving region so that external elements can be easily connected thereto. For example, the pad region PAD may be disposed around the active pixel sensor array region APS and may be disposed at the edge portion of the image sensor.

Figure 4:
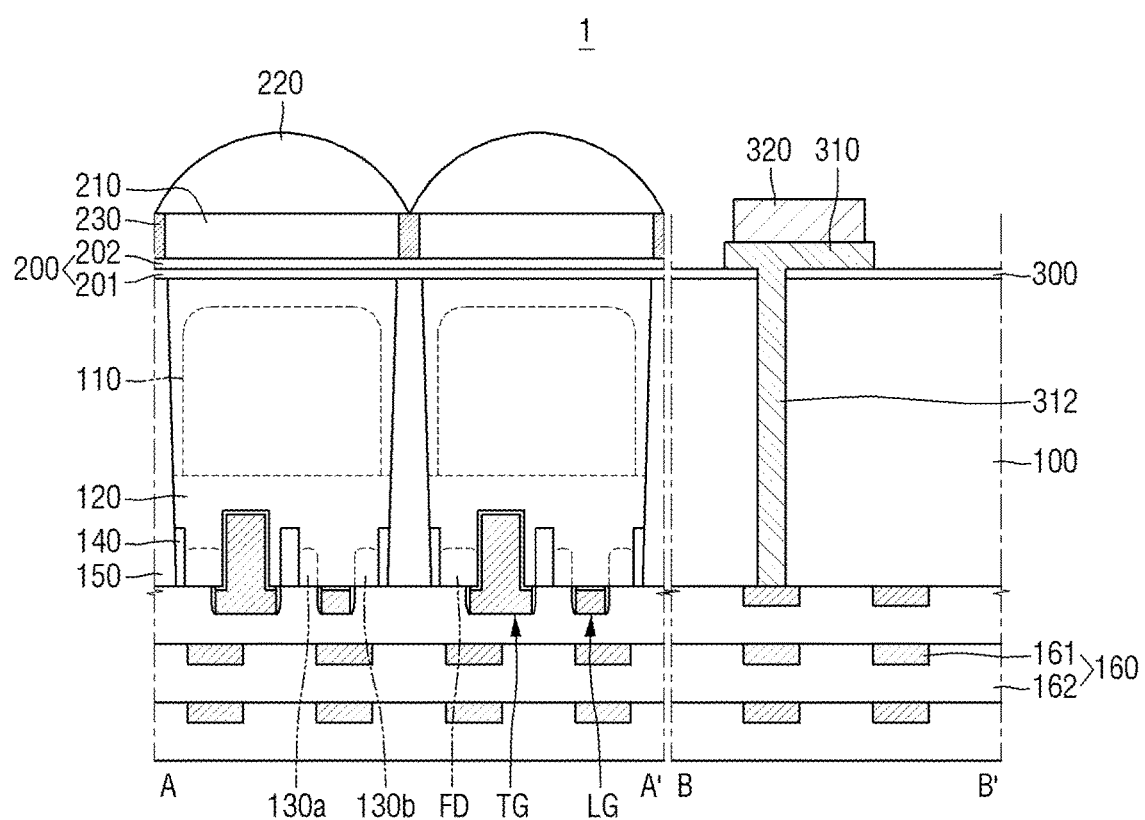
FIG. 4 is a cross-sectional view for illustrating an image sensor according to some exemplary embodiments of the present disclosure.

FIG. 4 is a cross-sectional view for illustrating an image sensor according to some exemplary embodiments of the present disclosure. FIG. 4 is a cross-sectional view taken along lines A-A' and B-B' of FIG. 3.

Referring to FIG. 4, an image sensor 1 includes, in the light-receiving region LRR (see FIG. 3), a substrate 100, a photoelectric conversion layer 110, a well impurity layer 120, a first element isolating layer 150, a second element isolating layer 140, a floating diffusion region FD, source and drain regions 130a and 130b, a transfer gate TG, a logic gate LG, a first wiring layer 160, an anti-reflection layer 200, a color filter layer 210, a grid pattern 230, and a microlens 220.

In addition, the image sensor 1 includes, in the pad region PAD (see FIG. 3), a substrate 100, a first wiring layer 160, a delamination-preventing layer 300, a second wiring layer 310, a plug 312, and a conductive pad 320.

The various pads of an image sensor 1 described herein may be conductive terminals connected to internal wiring of the image sensor 1 or substrate 100 respectively, and may transmit signals and/or supply voltages between an internal wiring and/or internal circuit of the image sensor 1 or substrate 100 and an external source or to another device (e.g., another image sensor or substrate). For example, the pads may electrically connect to and transmit supply voltages and/or signals between an integrated circuit of the image sensor 1 and a device to which the image sensor 1 is connected. The various pads may be provided on or near an external surface of the image sensor 1 or substrate 100 and may generally have a planar surface area (often larger than a corresponding surface area of the internal wiring to which they are connected) to promote connection to a further terminal, such as a bump or solder ball, and/or an internal or external wiring. However, the present disclosure is not limited thereto.

The substrate 100 may have a structure in which a base substrate and an epitaxial layer are stacked. The substrate 100 may be a silicon substrate, a gallium arsenide substrate, a silicon germanium substrate, a ceramic substrate, a quartz substrate, a glass substrate for a display, or a semiconductor on insulator (SOI) substrate. However, the technical idea of the present disclosure is not limited thereto.

The photoelectric conversion layer 110 may be disposed in the substrate 100 in the light-receiving region LRR. The photoelectric conversion layer 110 generates photogenerated charges in proportion to the intensity of the incident light. For example, the photoelectric conversion layer 110 may be a photodiode.

The photoelectric conversion layer 110 may be formed by doping impurities into the substrate 100. For example, the photoelectric conversion layer 110 may be formed by ion implantation of n-type impurities into the substrate 100. In addition, the photoelectric conversion layer 110 may have a difference in impurity concentration between the upper portion and the lower portion of the photoelectric conversion layer 110 so that there is a potential gradient. For example, the photoelectric conversion layer 110 may be formed by stacking a plurality of impurity regions.

The well impurity layer 120 may be disposed on the photoelectric conversion layer 110. The well impurity layer 120 may be formed by doping the substrate 100 with impurities of a conductivity type opposite to that of the photoelectric conversion layer 110. For example, the well impurity layer 120 may be formed by ion implantation of p-type impurities.

The first element isolating layer 150 may be disposed in the active pixel sensor array region APS (see FIG. 3) to define the active pixel AP (see FIG. 3) or the reference pixel RP (see FIG. 3). For example, a first element isolating layer 150 may surround the active pixel AP or the reference pixel RP and may be extended from the lower surface to the upper surface of the substrate 100 to separate the active pixel AP or the reference pixel RP.

In some embodiments, the first element isolating layer 150 may be formed by patterning the substrate 100 to form a deep trench, and then filling the deep trench with an insulative material. Accordingly, a first element isolating layer 150 may be extended from the lower surface to the upper surface of the substrate 100. In some patterning processes, a width of the upper surface of a first element isolating layer 150 in a direction horizontal to the upper surface of the substrate 100 may be smaller than a width of the lower surface of a first element isolating layer 150 in the direction horizontal to the upper surface of the substrate 100. In some embodiments, the width of a first element isolating layer 150 gradually decreases from the lower surface of the substrate 100 to the upper surface of the substrate 100. However, the present disclosure is not limited thereto.

The first element isolating layer 150 may be formed of an insulative material having a lower refractive index than that of the substrate 100. For example, when the substrate 100 is formed of silicon, the first element isolating layer 150 may be formed of a silicon oxide layer, a silicon nitride layer, an undoped polysilicon layer, air, or a combination thereof. The term "air" as discussed herein, may refer to atmospheric air, or other gases that may be present during the manufacturing process.

Accordingly, the first element isolating layer 150 can refract light obliquely incident on the photoelectric conversion layer 110. Also, the first element isolating layer 150 can prevent the photogenerated charges generated by incident light in a pixel region from moving to an adjacent pixel region by random drift. For example, the first element isolating layer 150 may improved the efficiency of receiving light by the photoelectric conversion layer 110 such that the image quality of the image data can be improved.

The second element isolating layer 140 may be disposed in the active pixel AP or the reference pixel RP to define an active region. For example, the second element isolating layer 140 may be formed in the well impurity layer 120 to define a region of the well impurity layer 120 in which the second element isolating layer 140 is not formed, as an active region.

In some embodiments, the second element isolating layer 140 may be formed by patterning the substrate 100 to form a shallow trench, and then filling the shallow trench with an insulative material. For example, the second element isolating layer 140 may be an impurity region having the same conductivity type as that of the well impurity layer 120. In this exemplary embodiment, the impurity concentration at the second element isolating layer 140 may be higher than the impurity concentration at the well impurity layer 120.

The depth of the second element isolating layer 140 may be shallower than the depth of the first element isolating layer 150. For example, the lowermost surface of the second element isolating layer 140 may exist in the substantially same plane with the lower most surface of the first element isolating layer 150. However, the uppermost surface of the second element isolating layer 140 in a first direction may be lower than the uppermost surface of the first element isolating layer 150 in the first direction. In addition, the second element isolating layer 140 may be spaced apart from the photoelectric conversion layer 110.

For example, the second element isolating layer 140 may define a floating diffusion region FD, and source and drain regions 130a and 130b in the well impurity layer 120. In some embodiments, the floating diffusion region FD and the source and drain regions 130a and 130b may be formed by doping impurities of a conductivity type opposite to that of the well impurity layer 120. For example, the floating diffusion region FD may be formed by ion implantation of n-type impurities.

The transfer gate TG may be disposed adjacent to the photoelectric conversion unit 110 and the floating diffusion region FD. Accordingly, the transfer gate TG may transfer the charges generated in the photoelectric conversion layer 110 to the floating diffusion region FD.

In some embodiments of the present disclosure, the transfer gate TG may have a portion that is inserted into the substrate 100, as shown in the drawings. For example, the transfer gate TG may be formed by forming a trench in the active region formed in the well impurity layer 120, forming a gate insulating layer and a gate conductive layer sequentially in the trench, and forming gate spacers on the side walls of the gate conductive layer. As a result, a portion of the transfer gate TG may penetrate a portion of the well impurity layer 120 to be buried in the well impurity layer 120. In this manner, the transfer gate TG can reduce the area of the active pixel AP or the reference pixel RP to achieve high integration of the image sensor.

The logic gate LG may be disposed adjacent to the source and drain regions 130a and 130b. The logic gate LG may correspond to at least one of the reset gate RG, the gate of the drive transistor DX, and the selection gate SG shown in FIG. 2.

For example, if the logic gate LG is the reset gate RG, the source or drain regions 130a and 130b may be connected to the supply voltage VDD and the floating diffusion region FD, respectively, and the logic gate LG may periodically reset the charges accumulated in the floating diffusion region FD.

For example, if the logic gate LG is the driving transistor DX, the logic gate LG may be connected to the floating diffusion region FD to amplify the potential change in the floating diffusion region FD and output it to an output line Vout.

For example, if the logic gate LG is the selection gate SG, the source or drain regions 130a or 130b may be connected to the drain electrode of the driving transistor DX to select a unit pixel to be read.

The first wiring layer 160 may be disposed on the lower surface of the substrate 100. The first wiring layer 160 may include a plurality of interlayer insulating layers 162 and a plurality of lines 161. The first wiring layer 160 may transmit driving signals, such as a pixel selection signal, a reset signal, and a charge transfer signal for operation of the image sensor. In addition, the first wiring layer 160 may connect the transfer gate TG and the logic gate LG which may be arranged in various ways.

The interlayer insulating layers 162 may be formed of an insulative material. For example, the interlayer insulating layers 162 may be formed of, but are not limited to, HDP (High Density Plasma), TOSZ (Tonen SilaZene), SOG (Spin On Glass), USG (Undoped Silica Glass).

The lines 161 may be conductive lines and may include, but are not limited to, a metal such as copper (Cu), aluminum (Al).

The anti-reflection layer 200 may be disposed on the photoelectric conversion layer 110. For example, the anti-reflection layer 200 may be conformally disposed on the substrate 100 including the photoelectric conversion layer 110 in the light-receiving region LRR.

The anti-reflection layer 200 can prevent reflection of incident light propagating from the upper surface of the substrate 100 back toward the substrate 100. In some embodiments, the anti-reflection layer 200 may be formed as a single layer, but the disclosure is not limited thereto. For example, in some embodiments, the anti-reflection layer 200 may be formed as a multilayer including a first subsidiary anti-reflection layer 201 (may also be referred to as the lowermost one of the subsidiary anti-reflection layers) and a second subsidiary anti-reflection layer 202 (may also be referred to as the uppermost one of the subsidiary anti-reflection layers), as shown in the drawings. In some embodiments, when the first subsidiary anti-reflection layer 201 and the second subsidiary anti-reflection layer 202 are formed of the same materials and structures (e.g., same material compositions), the anti-reflection layer 200 is formed as a single layer structure and when the first subsidiary anti-reflection layer 201 and the second subsidiary anti-reflection layer 202 are formed of different materials and structures (e.g., different material compositions), the anti-reflection layer 200 is formed as a multi-layer structure. For example, the anti-reflection layer 200 may include and/or may be formed of a material having a refractive index between the refractive index of air and the refractive index of the substrate 100 to prevent reflection of incident light. For example, the anti-reflection layer 200 may include silicon oxide, silicon nitride, silicon oxynitride, hafnium oxide, aluminum oxide, tantalum oxide, zirconium oxide, and combinations thereof. However, the technical idea of the present disclosure is not limited thereto.

For example, in some embodiments, the first subsidiary anti-reflection layer 201 including silicon oxide may be formed on the substrate 100 including silicon, and the second subsidiary anti-reflection layer 202 including silicon nitride may be formed on the first subsidiary anti-reflection layer 201.

The refractive index of silicon oxide is approximately 1.45 to 1.50, the refractive index of silicon nitride is approximately 1.95 to 2.05, and the refractive index of silicon is approximately 3.5. Therefore, it is possible to prevent the incident light from being reflected on the substrate 100 by Snell's Law by forming the first subsidiary anti-reflection layer 201 including silicon oxide on the photoelectric conversion layer 110 and by forming the second subsidiary anti-reflection layer 202 including silicon nitride on the first subsidiary anti-reflection layer 201. Therefore, the refractive index value of the first subsidiary anti-reflection layer 201 is lower than the refractive index value of the second subsidiary anti-reflection layer 202 and the refractive index value of the substrate 100 is greater than both the refractive index value of the first subsidiary anti-reflection layer 201 and the refractive index value of the second subsidiary anti-reflection layer 201. In some embodiments, a ratio of the refractive index value of the first subsidiary anti-reflection layer 201 to the refractive index value of the second subsidiary anti-reflection layer 202 is a value ranging from about 0.7 to about 0.8, a ratio of the refractive index value of the first subsidiary anti-reflection layer 201 to the refractive index value of the substrate 100 is a value ranging from about 0.41 to about 0.43, and a ratio of the refractive index value of the second subsidiary anti-reflection layer 202 to the refractive index value of the substrate 100 is a value ranging from about 0.56 to about 0.58. However, the present disclosure is not limited thereto.

The thickness and the material of the anti-reflection layer 200 may vary depending on the type of incident light. For example, visible ray of approximately 450 nm to 550 nm can be transmitted efficiently when the anti-reflection layer 200 is formed on the substrate 100, which is composed of a $SiO_2$ layer having a thickness of 1,600 Å, a SiON layer having a thickness of 80 Å, and a SiN layer having a thickness of 400 Å sequentially disposed on the photoelectric conversion layer 110. In addition, for example, visible ray of approximately 520 nm or higher can be transmitted efficiently when the anti-reflection layer 200 is formed on the substrate 100, which is composed of a $SiO_2$ layer having a thickness of 600 Å, a SiON layer having a thickness of 1,500 Å, and a SiN layer having a thickness of 200 Å sequentially disposed on the photoelectric conversion layer 110.

The color filter layer 210 may include a red, green or blue color filter depending on the unit pixel. The color filter may be arranged in two-dimension and may include a yellow filter, a magenta filter, and a cyan filter. Further, the color filter layer 210 may further include a white filter. In some embodiments of the present disclosure, however, the image sensor 1 may not include the color filter layer 210.

The grid pattern 230 may be arranged on the substrate 100 in a lattice shape. For example, the grid pattern 230 may be formed on the anti-reflection layer 200 and disposed between the color filters 210. The grid pattern 230 may reflect incident light obliquely incident on the substrate 100 to increase the amount of incident light provided to the photoelectric conversion layer 110. In some embodiments of the present disclosure, however, the image sensor 1 may not include the grid pattern 230.

The microlens 220 may be disposed on the anti-reflection layer 200. For example, the microlens 220 may be disposed on the color filter layer 210 on the anti-reflection layer 200. The microlens 220 has a convex shape with reference to the upper surface of the substrate 100 and may have a predetermined radius of curvature. Accordingly, the microlens 220 can condense incident light on the photoelectric conversion layer 110. The microlens 220 may include, but is not limited to, a light-transmitting resin.

The delamination-preventing layer 300 may be disposed on the substrate 100 in the pad region PAD. The delamination-preventing layer 300 may be disposed conformally on the substrate 100 in the pad region PAD. Accordingly, the lower surface of the anti-reflection layer 200 and the lower surface of the delamination-preventing layer 300 may be disposed in the substantially same plane. The delamination-preventing layer 300 may be formed as a single layer, but the technical idea of the present disclosure is not limited thereto. For example, the delamination-preventing layer 300 may be formed as multiple layers.

The delamination-preventing layer 300 can prevent the delamination of the second wiring layer 310 disposed on the substrate 100 in the pad region PAD. For example, the delamination-preventing layer 300 is interposed between the substrate 100 including silicon and the second wiring layer 310 including a metal, and can prevent the delamination caused by weak adhesive force between silicon and the metal. The delamination-preventing layer 300 may be disposed directly on the substrate 100 and the second wiring layer 130, and so may contact both the substrate 100 and the second wiring layer 130.

For example, the delamination-preventing layer 300 may include a material having good adhesion to both silicon and the metal to prevent the delamination. For example, the adhesion strength between the wiring layer 310 and the delamination-preventing layer 300 may be higher than an adhesion strength between the wiring layer 310 and the substrate 100, and the adhesion strength between the substrate 100 and the delamination-preventing layer 300 may be higher than an adhesion strength between the wiring layer 310 and the substrate 100. For example, in some embodiments, the delamination-preventing layer 300 may include a delamination-preventing material such as silicon oxide, silicon nitride, silicon oxynitride, hafnium oxide, aluminum oxide, tantalum oxide, zirconium oxide, and combinations thereof. However, the technical idea of the present disclosure is not limited thereto.

The delamination-preventing layer 300 may include a different material from the anti-reflection layer 200 disposed on the substrate 100 in the light-receiving region LRR. For example, the anti-reflection layer 200 may include a material optimized to prevent reflection of incident light, and the delamination-preventing layer 300 may include a material optimized to prevent the delamination of the second wiring layer 310. For example, the delamination-preventing layer 300 may include a material not included in the anti-reflection layer 200, or may include a same material layer as the anti-reflection layer 200, which material layer is closer to the substrate 100 on the pad region PAD of the substrate 100 than on the light-receiving region LRR of the substrate 100.

For example, when the anti-reflection layer 200 is multilayer structure, each of the first subsidiary anti-reflection layer 201 and the second subsidiary anti-reflection layer 202 of the anti-reflection layer 200 may be optimized to prevent reflection of incident light, and the delamination-preventing layer 300 may be optimized to prevent the delamination of the second wiring layer 310.

In some embodiments of the present disclosure, the first subsidiary anti-reflection layer 201 disposed at the lowermost portion of the anti-reflection layer 200 may have a material different from that of the delamination-preventing layer 300. For example, the first subsidiary anti-reflection layer 201 of the anti-reflection layer 200 may include a first material composition and the delamination-preventing layer 300 may include a second material composition different from the first material composition. In some embodiments, the anti-reflection layer 200 may include a material not included the delamination-preventing layer 300.

The second wiring layer 310 may be disposed on the substrate 100 in the pad region PAD. In some embodiments, the second wiring layer 310 may be disposed directly on the delamination-preventing layer 300. The second wiring layer 310 is disposed in the pad region PAD and may have the conductive pad 320 mounted thereon that is used for inputting/outputting a control signal and a photoelectric signal to/from the active pixel sensor array region APS (see FIG. 3).

The second wiring layer 310 may be a conductive wiring layer and may include, but is not limited to, a metal such as copper (Cu) or aluminum (Al), like the plurality of line 161 of the first wiring layer 160.

The plug 312 may be connected to the second wiring layer 310 via the substrate 100 and the delamination-preventing layer 300 in the pad region PAD. For example, the plug 312 electrically connects the plurality of lines 161 of the first wiring layer 160 with the second wiring layer 310 via the substrate 100 and the delamination-preventing layer 300 in the pad region PAD.

The plug 312 may include, but is not limited to, a metal such as copper (Cu) or aluminum (Al), for example, like the first and second wiring layers 310.

The conductive pad 320 may be disposed on the second wiring layer 310. For example, the conductive pad 320 disposed in the pad region PAD may input/output a control signal and a photoelectric signal to the active pixel sensor array region APS by using the first and second wiring layers 160 and 310 and the plug 312.

The conductive pad 320 may include, but is not limited to, aluminum (Al).

As described above, the anti-reflection layer 200 may be formed on the substrate 100 to prevent reflection of incident light. However, the anti-reflection layer 200 optimized to prevent the reflection of the incident light may not be suitable for preventing the delamination of the second wiring layer 310 in the pad region PAD.

In addition, as described above, the delamination-preventing layer 300 may be formed on the substrate 100 to prevent the delamination of the second wiring layer 310. However, the delamination-preventing layer 300 optimized for preventing the delamination of the second wiring layer 310 may not be suitable for preventing the reflection of incident light in the light-receiving region LRR.

In view of the above, the image sensor 1 according to some embodiments of the present disclosure improves the reliability by using the anti-reflection layer 200 and the delamination-preventing layer 300 including different materials. For example, in the image sensor 1, the anti-reflection layer 200 including a material optimized for preventing reflection of incident light is disposed in the light-receiving region LRR, and the delamination-preventing layer 300 including a material optimized for preventing delamination of the second wiring layer 310 is disposed in the pad region PAD, thereby improving the reliability of the image sensor.

Hereinafter, an image sensor 2 according to some exemplary embodiments of the present disclosure will be described with reference to FIG. 5. Redundant descriptions on identical functions and elements described above with reference to FIGS. 1 to 4 will be omitted for convenience of illustration.

Figure 5:
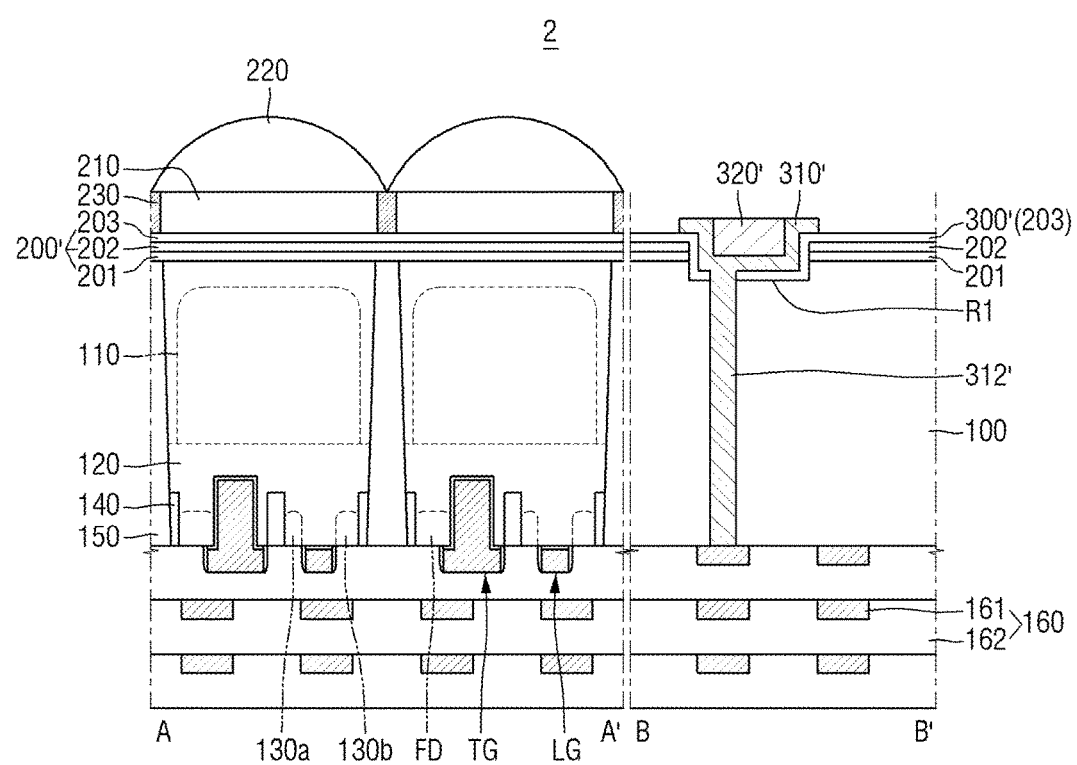
FIG. 5 is a cross-sectional view for illustrating an image sensor according to some exemplary embodiments of the present disclosure.

FIG. 5 is a cross-sectional view for illustrating an image sensor according to some exemplary embodiments of the present disclosure. FIG. 5 is a cross-sectional view taken along lines A-A' and B-B' of FIG. 3.

Referring to FIG. 5, the image sensor 2 includes an anti-reflection layer 200' in the light-receiving region LRR (see FIG. 3).

In addition, the image sensor 2 includes, in the pad region PAD (see FIG. 3), a recess R1, a first subsidiary anti-reflection layer 201 and a second subsidiary anti-reflection layer 202, a delamination-preventing layer 300', a second wiring layer 310', a plug 312', and a conductive pad 320'.

The anti-reflection layer 200' may be disposed on the photoelectric conversion layer 110. For example, the anti-reflection layer 200' may be conformally disposed on the substrate 100 including the photoelectric conversion layer 110 in the light-receiving region LRR.

The anti-reflection layer 200' may be formed as a single layer or as a multilayer including a first subsidiary anti-reflection layer 201, a second subsidiary anti-reflection layer 202 and a third subsidiary anti-reflection layer 203 as shown in the drawings. For example, the anti-reflection layer 200' may further include a third subsidiary anti-reflection layer 203 disposed on the anti-reflection layer 200 shown in FIG. 4.

The third subsidiary anti-reflection layer 203, like the first subsidiary anti-reflection layer 201 and the second subsidiary anti-reflection layer 202, may include a material having a refractive index between the refractive index of air and the refractive index of the substrate 100 to prevent reflection of incident light.

The recess R1 may be formed in a portion of the substrate 100 in the pad region PAD. In some embodiments, the recess R1 may be formed by etching a portion of the substrate 100 in the pad region PAD. For example, the recess R1 may refer to a depressed portion of the substrate 100 in the pad region PAD by etching.

The first subsidiary anti-reflection layer 201 and the second subsidiary anti-reflection layer 202 may be disposed also on the substrate 100 in the pad region PAD, unlike the image sensor 1 of FIG. 4. The first and second subsidiary anti-reflection layers 201 and 202 may be disposed on a portion of the substrate 100 in the pad region PAD where the recess R1 is not formed. For example, the first and second subsidiary anti-reflection layers 201 and 202 may not be formed on the recess R1.

The delamination-preventing layer 300' may be disposed on the substrate 100 in the pad region PAD. For example, the delamination-preventing layer 300' may be disposed conformally on the substrate 100 and the first and second subsidiary anti-reflection layers 201 and 202 in the pad region PAD.

More For example, the delamination-preventing layer 300' may be disposed conformally on the first and second subsidiary anti-reflection layers 201 and 202 in the pad region PAD where the recess R1 is not formed, and may be formed on the substrate 100 in the pad region PAD where the recess R1 is formed.

For example, the delamination-preventing layer 300' may be disposed conformally on the bottom surface and the side walls of the recess R1, unlike the first subsidiary anti-reflection layer 201 and the second subsidiary anti-reflection layer 202. Accordingly, the lowermost surface of the anti-reflection layer 200' may be positioned higher in a first direction than the position of the lowermost surface of the delamination-preventing layer 300' on the recess R1 in the first direction. The delamination-preventing layer 300' may be formed as a single layer, but the technical idea of the present disclosure is not limited thereto. For example, the delamination-preventing layer 300' may be formed as multiple layers.

The anti-delamination layer 300' can prevent the delamination of the second wiring layer 310' disposed on the substrate 100 in the pad region PAD. For example, the delamination-preventing layer 300' may be disposed directly under the second wiring layer 310' to prevent the delamination of the second wiring layer 310'.

In some embodiments, the subsidiary anti-reflection layer disposed on the top of the anti-reflection layer 200', i.e., the third subsidiary anti-reflection layer 203 may be substantially the same layer as the delamination-preventing layer 300'. For example, the delamination-preventing layer 300' may be formed in the same process step with the third subsidiary anti-reflection layer 203 and thus may form a continuous layer. Accordingly, the manufacturing process of the image sensor 2 can be simplified. This will be described later with reference to FIG. 14.

For example, the third subsidiary anti-reflection layer 203 or the delamination-preventing layer 300' can prevent the reflection of incident light in the light-receiving region LRR, and the delamination of the second wiring layer 310' as well. For example, the third subsidiary anti-reflection layer 203 or the delamination-preventing layer 300' may be combined with the first subsidiary anti-reflection layer 201 and the second subsidiary anti-reflection layer 202 to be optimized to prevent reflection of incident light and to prevent delamination of the second wiring layer 310'.

The second wiring layer 310' may be disposed above the substrate 100 in the pad region PAD. For example, the second wiring layer 310' may be disposed directly on the delamination-preventing layer 300' on the recess R1. Accordingly, the second wiring layer 310' may be disposed on the bottom surface and side walls of the recess R1.

In addition, the second wiring layer 310' may be extended from the side walls of the recess R1 to be disposed directly on the delamination-preventing layer 300' disposed above the substrate 100 where the recess R1 is not formed. However, the technical idea of the present disclosure is not limited thereto. For example, the second wiring layer 310' may be formed directly on the delamination-preventing layer 300' on the recess R1.

The second wiring layer 310' is disposed in the pad region PAD and may have the conductive pad 320' mounted thereon that is used for inputting/outputting a control signal and a photoelectric signal to/from the active pixel sensor array region APS (see FIG. 3).

The plug 312' may be connected to the second wiring layer 310' via the substrate 100 and the delamination-preventing layer 300' in the pad region PAD. For example, the plug 312' may penetrate the recess R1 of the substrate 100 and the delamination-preventing layer 300' disposed on the recess R1. Accordingly, the plug 312' may electrically connect the plurality of lines 161 of the first wiring layer 160 with the second wiring layer 310'.

The conductive pad 320' may be disposed on the second wiring layer 310'. For example, the conductive pad 320' may be disposed on the second wiring layer 310' formed on the recess R1 and buried in the recess R1.

The conductive pad 320' may require a certain thickness for inputting and outputting a control signal, a photoelectric signal and the like to the active pixel sensor array region APS. However, the conductive pad 320' disposed on the substrate 100 in the pad region PAD creates a level difference between the active pixel sensor array region APS (see FIG. 3) and the pad region PAD. Accordingly, by burying the conductive pad 320' in the recess R1 the level difference between the active pixel sensor array region APS and the pad region PAD is reduced.

Accordingly, the image sensor 2 according to some embodiments of the present disclosure improves the reliability by using the anti-reflection layer 200' and the delamination-preventing layer 300' including different materials.

In addition, in the image sensor 2, the third subsidiary anti-reflection layer 203 disposed on the top of the anti-reflection layer 200' and the delamination-preventing layer 300' are formed via the same process, thereby simplify the manufacturing process to improve the reliability of the image sensor. In addition, the image sensor 2 reduces the level difference between the active pixel sensor array region APS and the pad region PAD by using the conductive pad 320' buried in the recess R1.

Hereinafter, an image sensor 3 according to some exemplary embodiments of the present disclosure will be described with reference to FIG. 6. Redundant descriptions on identical functions and elements described above with reference to FIGS. 1 to 5 will be omitted for convenience of illustration.

Figure 6:
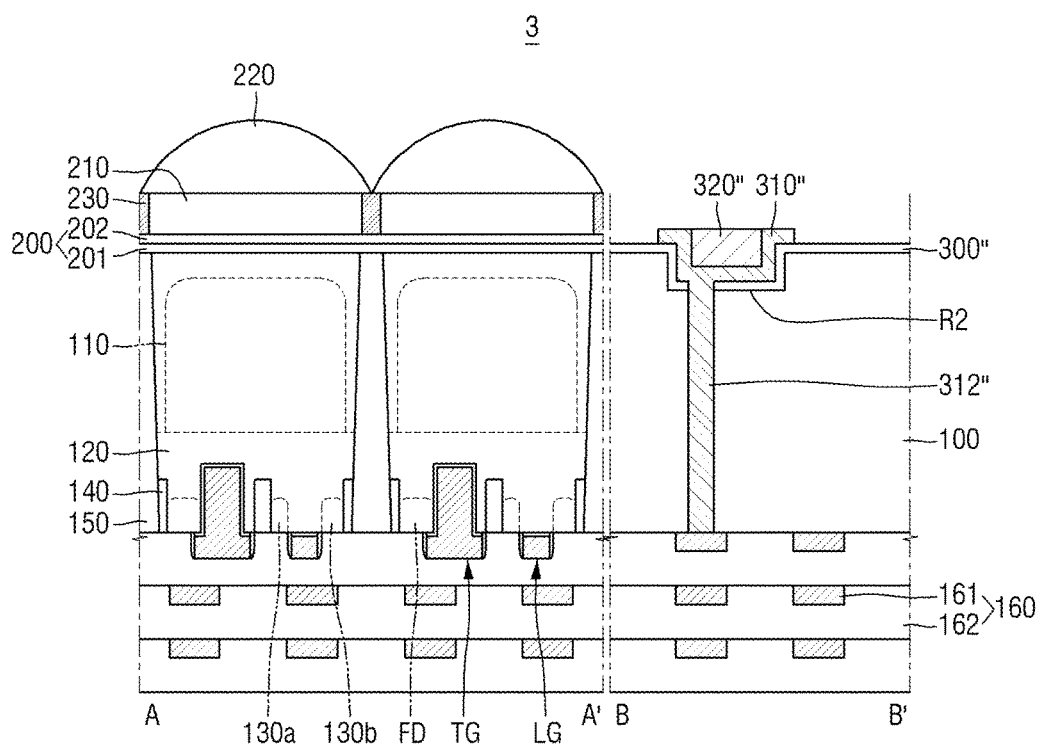
FIG. 6 is a cross-sectional view for illustrating an image sensor according to some exemplary embodiments of the present disclosure.

FIG. 6 is a cross-sectional view for illustrating an image sensor according to some exemplary embodiments of the present disclosure. FIG. 6 is a cross-sectional view taken along lines A-A' and B-B' of FIG. 3.

Referring to FIG. 6, an image sensor 3 includes, in the pad region PAD (see FIG. 3), a recess R2, a delamination-preventing layer 300", a second wiring layer 310", a plug 312", and a conductive pad 320".

The recesses R2, the delamination-preventing layer 300", the second wiring layer 310", the plug 312" and the conductive pad 320" are the counterparts of the recess R1, the delamination-preventing layer 300', the second wiring layer 310', the plug 312' and the conductive pad 320' of FIG. 5, respectively.

The recess R2 may be formed deeper than the recess R1 of FIG. 5. For example, the recess R2 may be formed deeper than the recess R1 of FIG. 5 by the thickness equal to the first subsidiary anti-reflection layer 201 and the second subsidiary anti-reflection layer 202. However, the technical idea of the present disclosure is not limited to this, and the depth of the recess R2 may vary depending on desired parameters.

The delamination-preventing layer 300" may be disposed on the substrate 100 in the pad region PAD. In some embodiments, the delamination-preventing layer 300" may be disposed conformally on the substrate 100 in the pad region PAD.

For example, the delamination-preventing layer 300' may be disposed conformally on the bottom surface and side walls of the recess R2. Accordingly, the lowermost surface of the anti-reflection layer 200 in a first direction may be higher than the lowermost surface of the delamination-preventing layer 300" on the recess R2 in the first direction.

The delamination-preventing layer 300" can prevent the delamination of the second wiring layer 310" disposed on the substrate 100 in the pad region PAD. For example, the delamination-preventing layer 300" is interposed between the substrate 100 including silicon and the second wiring layer 310" including a metal, and can prevent the delamination caused by weak adhesive force between silicon and the metal.

The delamination-preventing layer 300" may include a different material from the anti-reflection layer 200 disposed on the substrate 100 in the light-receiving region LRR. For example, the anti-reflection layer 200 may include a material optimized to prevent reflection of incident light, and the delamination-preventing layer 300" may include a material optimized to prevent the delamination of the second wiring layer 310".

For example, the first subsidiary anti-reflection layer 201 and the second subsidiary anti-reflection layer 202 may be optimized to prevent reflection of incident light, and the delamination-preventing layer 300" may be optimized to prevent the delamination of the second wiring layer 310".

Accordingly, the image sensor 3 according to some embodiments of the present disclosure improves the reliability by using the anti-reflection layer 200 and the delamination-preventing layer 300" including different materials. For example, in the image sensor 3, the anti-reflection layer 200 including a material optimized for preventing reflection of incident light is disposed in the light-receiving region LRR, and the delamination-preventing layer 300" including a material optimized for preventing delamination of the second wiring layer 310" is disposed in the pad region PAD, thereby improving the reliability of the image sensor.

In addition, the image sensor 3 reduces the level difference between the active pixel sensor array region APS and the pad region PAD by using the conductive pad 320" buried in the recess R2.

Hereinafter, a method for fabricating the image sensor 1 according to some exemplary embodiments of the present disclosure will be described with reference to FIGS. 7 to 12. Redundant descriptions on identical functions and elements described above with reference to FIGS. 1 to 6 will be omitted for convenience of illustration.

FIGS. 7 to 12 are views for illustrating processing steps of a method for fabricating the image sensor of FIG. 4.

Figure 7:
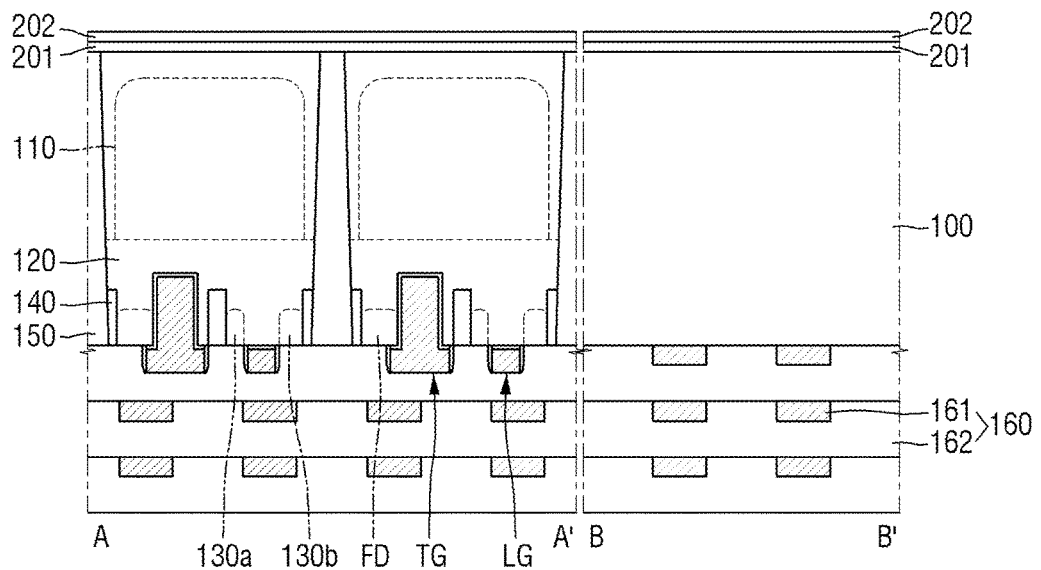
FIGS. 7 to 12 are views for illustrating processing steps of a method for fabricating the image sensor of FIG. 4.

Referring to FIG. 7, a substrate 100 having a photoelectric conversion layer 110 formed thereon is prepared, and first subsidiary anti-reflection layer 201 and second subsidiary anti-reflection layer 202 are sequentially formed on the substrate 100.

For example, the first subsidiary anti-reflection layer 201 may be formed on the substrate 100 and the first element isolating layer 150, and the second subsidiary anti-reflection layer 202 may be formed on the first subsidiary anti-reflection layer 201. The first subsidiary anti-reflection layer 201 and the second subsidiary anti-reflection layer 202 may be formed on the entire surface of the substrate 100. For example, the first subsidiary anti-reflection layer 201 and the second subsidiary anti-reflection layer 202 may be formed in both the light-receiving region LRR (see FIG. 3) and the pad region PAD (see FIG. 3).

The first subsidiary anti-reflection layer 201 and the second subsidiary anti-reflection layer 202 may be formed by a deposition process or a diffusion process. For example, the first subsidiary anti-reflection layer 201 and the second subsidiary anti-reflection layer 202 may be sequentially formed using a chemical vapor deposition (CVD) process.

Figure 8:
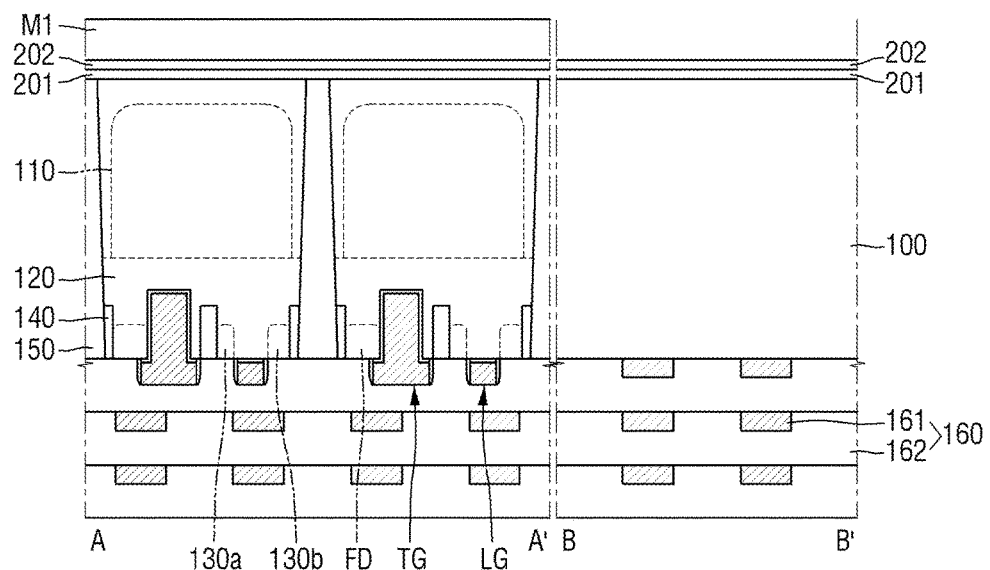

Referring to FIG. 8, a mask M1 is formed on first subsidiary anti-reflection layer 201 and second subsidiary anti-reflection layer 202 formed on the substrate 100 in the light-receiving region LRR.

The mask M1 may be formed by, for example, using a photolithography process. For example, the mask M1 may be a photoresist (not shown).

For example, a photoresist may be formed on the entire surface of the substrate 100, and the photoresist may be exposed to light and developed to pattern the photoresist. In doing so, the photoresist may be patterned to remove the mask M1 formed on the substrate 100 in the pad region PAD. For example, the photoresist may be patterned to form the mask M1.

Figure 9:
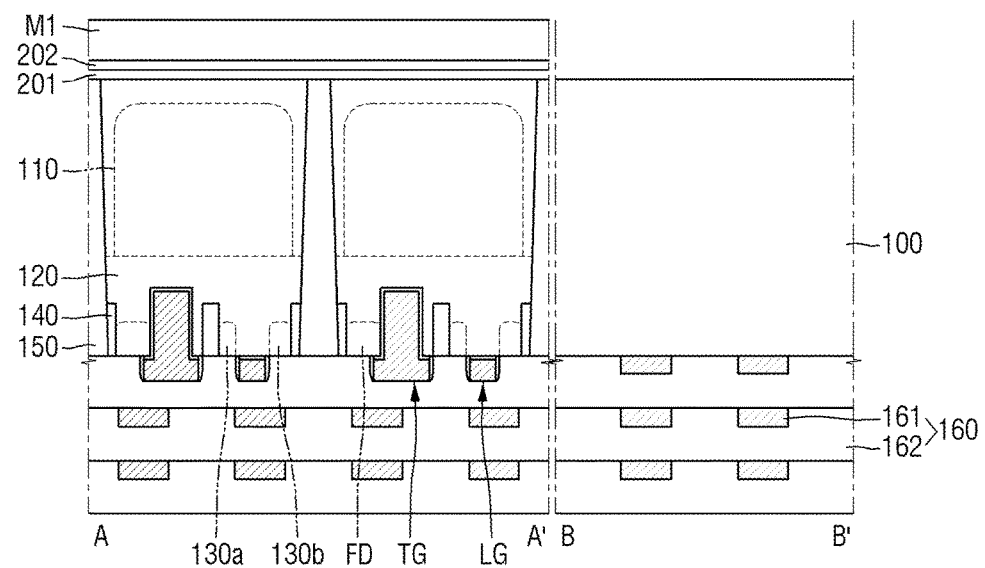

Referring to FIG. 9, in the pad region PAD, the first subsidiary anti-reflection layer 201 and the second subsidiary anti-reflection layer 202 formed on the substrate 100 are removed.

For example, the first subsidiary anti-reflection layer 201 and the second subsidiary anti-reflection layer 202 formed on the substrate 100 in the pad region PAD may be etched by using the mask M1 as the etch mask.

The first subsidiary anti-reflection layer 201 and the second subsidiary anti-reflection layer 202 formed on the substrate 100 in the light-receiving region LRR may be protected by the mask M1 and may not be etched.

Figure 10:
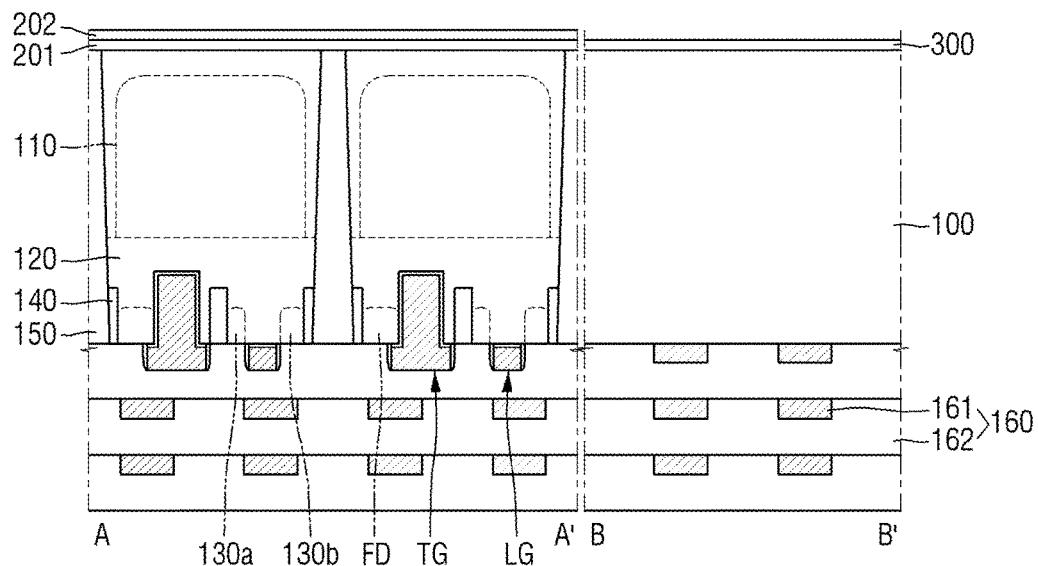

Referring to FIG. 10, a delamination-preventing layer 300 is formed on the substrate 100 in the pad region PAD.

The delamination-preventing layer 300 may be formed by a deposition process or a diffusion process. For example, the delamination-preventing layer 300 may be sequentially formed using a CVD (Chemical Vapor Deposition) process.

The delamination-preventing layer 300 may not be formed on the substrate 100 in the light-receiving region LRR. For example, in one embodiment, after the delamination-preventing layer 300 is formed on the entire surface of the substrate 100, the delamination-preventing layer 300 formed on the substrate 100 in the light-receiving region LRR may be removed by a method such as the above-described photolithography process. However, the technical idea of the present disclosure is not limited thereto, and the delamination-preventing layer 300 may be formed on the substrate 100 in the pad region PAD in various ways.

Figure 11:
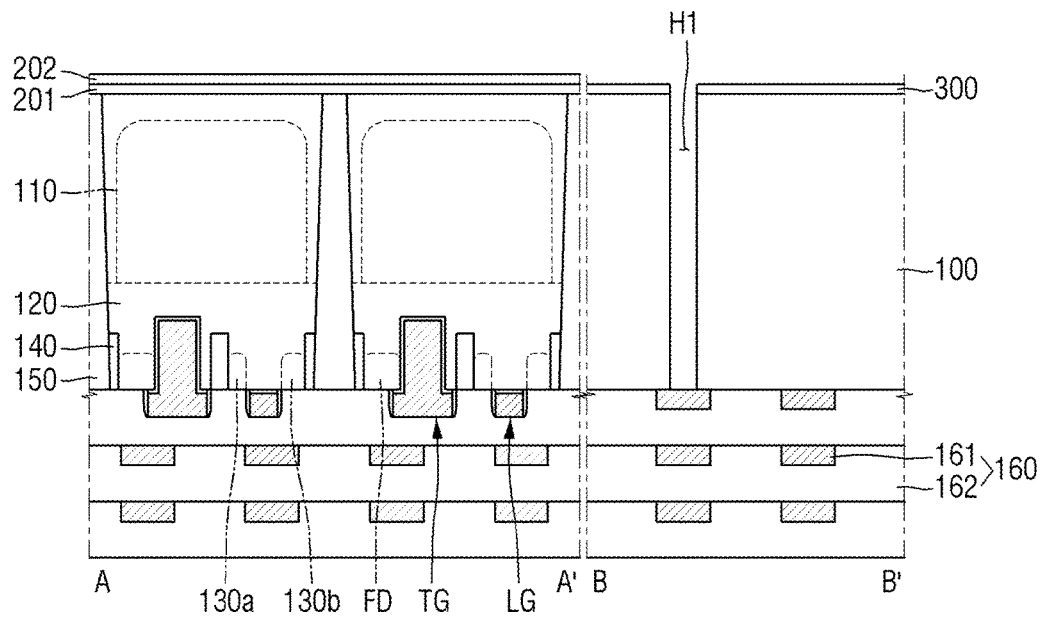

Referring to FIG. 11, a through hole H1 for exposing a first wiring layer 160 is formed in the substrate 100 in the pad region PAD.

For example, by etching a portion of the substrate 100 and a portion of the delamination-preventing layer 300 in the pad region PAD, it is possible to form the through hole H1 via which the first wiring layer 160 is exposed. Although only one through hole H1 is shown in FIG. 11, the technical idea of the present disclosure is not limited thereto. For example, more than one through holes may be formed as desired.

Figure 12:
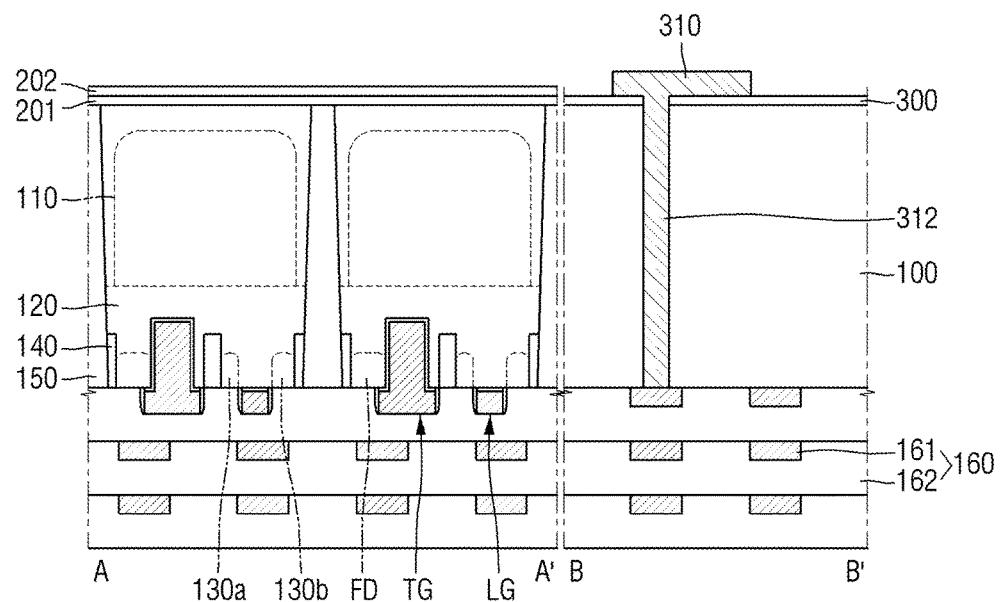

Referring to FIG. 12, a plug 312 with which the through hole H1 is filled, and a second wiring layer 310 connected to the plug 312 and disposed on the substrate 100 are formed.

For example, the plug 312 and the second wiring layer 310 may be formed together by a wiring process such as a damascene process. However, the technical idea of the present disclosure is not limited thereto. For example, the plug 312 and the second wiring layer 310 may be formed by patterning a conductive material. In addition, the plug 312 and the second wiring layer 310 may be formed independently.

Subsequently, a conductive pad 320 may be formed on the second wiring layer 310 to form the image sensor 1 according to FIG. 4.

Hereinafter, a method for fabricating the image sensor 1 according to some exemplary embodiments of the present disclosure will be described with reference to FIGS. 13 to 16. Redundant descriptions on identical functions and elements described above with reference to FIGS. 1 to 12 will be omitted for convenience of illustration.

FIGS. 13 to 16 are views for illustrating processing steps of a method for fabricating the image sensor of FIG. 5.

Figure 13:
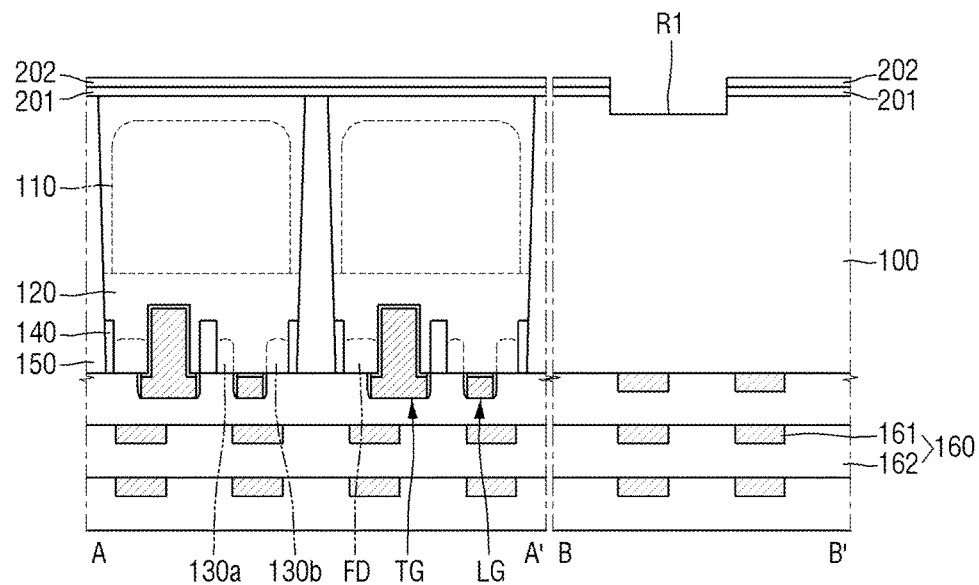
FIGS. 13 to 16 are views for illustrating processing steps of a method for fabricating the image sensor of FIG. 5.

Referring to FIGS. 7 and 13, a recess R1 is formed in the substrate 100 in the pad region PAD where the first subsidiary anti-reflection layer 201 and the second subsidiary anti-reflection layer 202 are formed.

For example, the recess R1 may be formed by etching a part of each of the first subsidiary anti-reflection layer 201 and the second subsidiary anti-reflection layer 202 and a part of the substrate 100 thereunder. Accordingly, the recess R1 may expose the sidewalls of each of the first subsidiary anti-reflection layer 201 and the second subsidiary anti-reflection layer 202 and the inside of the substrate 100.

Figure 14:
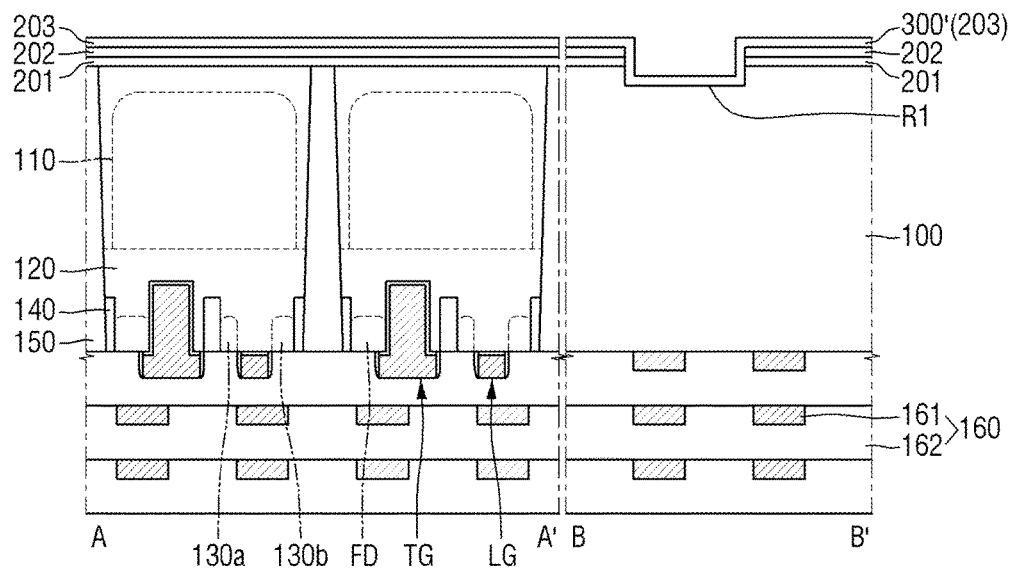

Referring to FIG. 14, a third subsidiary anti-reflection layer 203 and a delamination-preventing layer 300' are formed on the substrate 100.

For example, the third subsidiary anti-reflection layer 203 is formed on the second subsidiary anti-reflection layer 202 in the light-receiving region LRR, and the delamination-preventing layer 300' is formed on the second subsidiary anti-reflection layer 202 and the recesses R1 in the pad region PAD.

The third subsidiary anti-reflection layer 203 may be substantially the same layer as the delamination-preventing layer 300' Also, the third subsidiary anti-reflection layer 203 and the delamination-preventing layer 300' may be formed in the same processing step. For example, a silicon nitride layer may be formed on the structure of FIG. 13 via a CVD process. In this exemplary embodiment, the silicon nitride layer formed on the second subsidiary anti-reflection layer 202 in the light-receiving region LRR works as the third subsidiary anti-reflection layer 203, while the silicon nitride layer formed on the second subsidiary anti-reflection layer 202 and the recess R1 in the pad region PAD works as the delamination-preventing layer 300'.

For example, it is possible to prevent reflection of incident light. In addition, the manufacturing process can become simpler by forming the material that can prevent the delamination of the second wiring layer 310 on the entire surface of the substrate 100.

Figure 15:
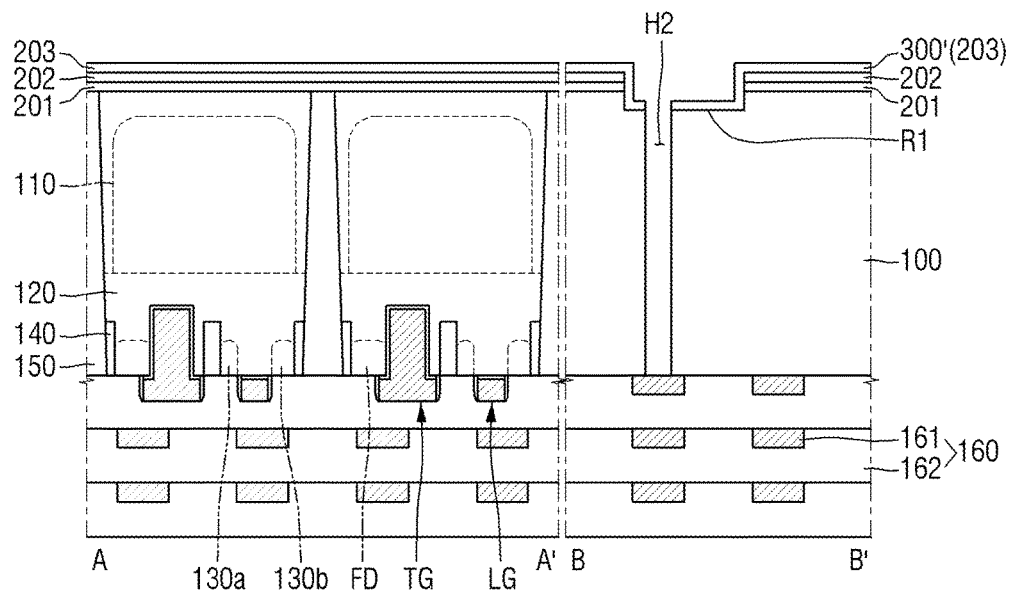

Referring to FIG. 15, a through hole H2 for exposing the first wiring layer 160 is formed in the substrate 100 in the pad region PAD.

For example, the through hole H2 may be formed in the recess R1 of the substrate 100. The through hole H2 is formed in the same manner as the through hole H1 described above with reference to FIG. 11.

Figure 16:
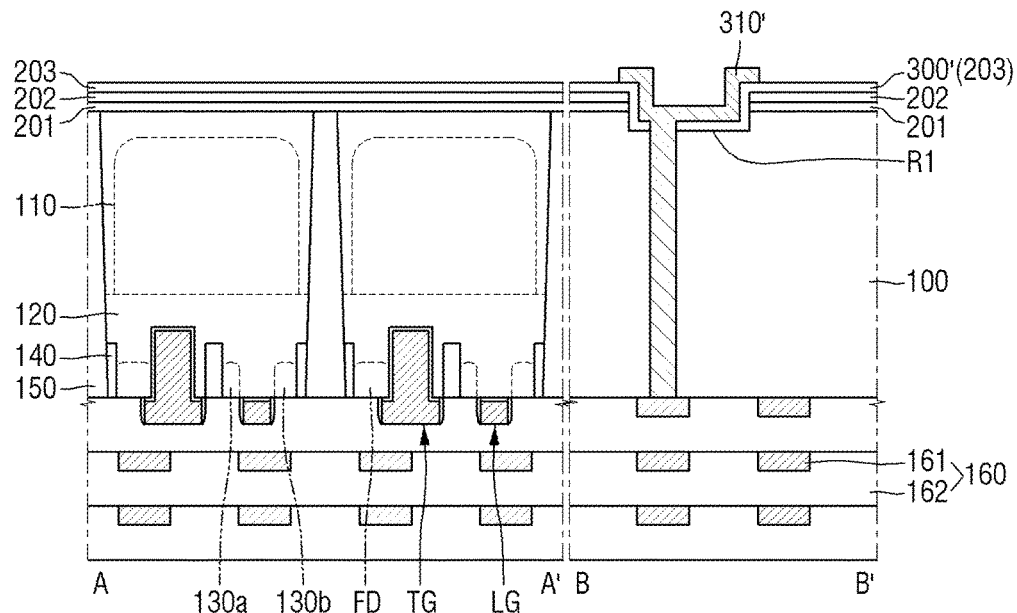

Referring to FIG. 16, a plug 312' with which the through hole H2 is filled, and a second wiring layer 310 connected to the plug 312' and disposed on the substrate 100 are formed. The plug 312' and the second wiring layer 310 are formed in the same manner as the plug 312 and the second wiring layer 310 described above with reference to FIG. 12, respectively.

Accordingly, the second wiring layer 310 may be formed directly on the delamination-preventing layer 300' on the recess R1. For example, the second wiring layer 310 may be disposed on the bottom surface and side walls of the recess R1. In addition, the second wiring layer 310' may be extended from the side walls of the recess R1 to be formed directly on the delamination-preventing layer 300' disposed above the substrate 100 where the recess R1 is not formed.

Subsequently, a conductive pad 320' may be formed on the second wiring layer 310 to form the image sensor 2 according to FIG. 5.

Hereinafter, a method for fabricating the image sensor 3 according to some exemplary embodiments of the present disclosure will be described with reference to FIGS. 17 to 20. Redundant descriptions on identical functions and elements described above with reference to FIGS. 1 to 16 will be omitted for convenience of illustration.

FIGS. 17 to 20 are views for illustrating processing steps of a method for fabricating the image sensor of FIG. 6.

Figure 17:
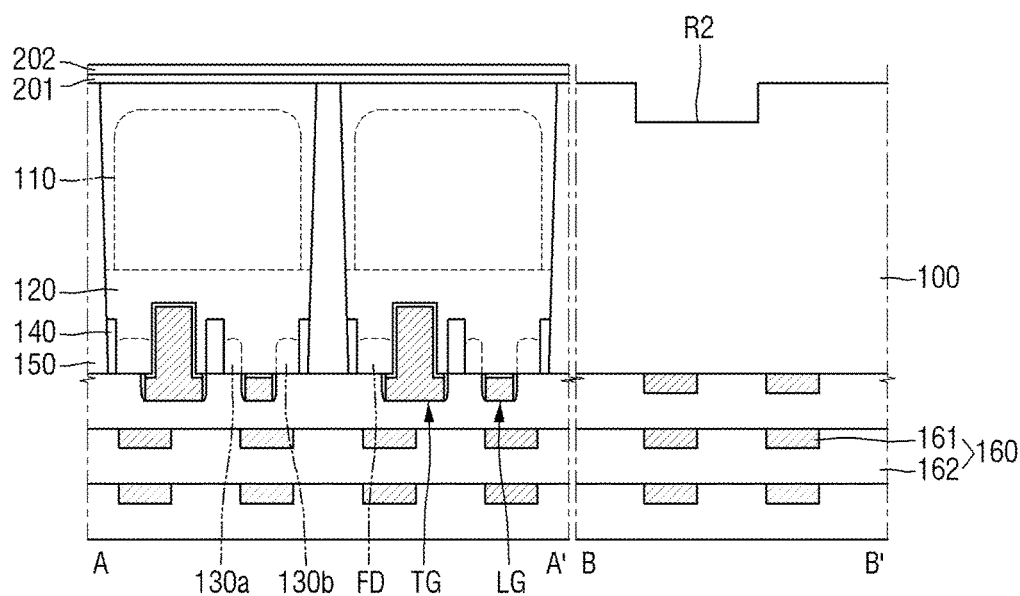
FIGS. 17 to 20 are views for illustrating processing steps of a method for fabricating the image sensor of FIG. 6.

Referring to FIGS. 9 and 17, a recess R2 is formed in the substrate 100 in the pad region PAD.

For example, the recess R2 may be formed by etching a portion of the substrate 100 in the pad region PAD. Accordingly, the recess R2 may expose the inside of the substrate 100. The mask M1 of FIG. 9 may be removed.

Figure 18:
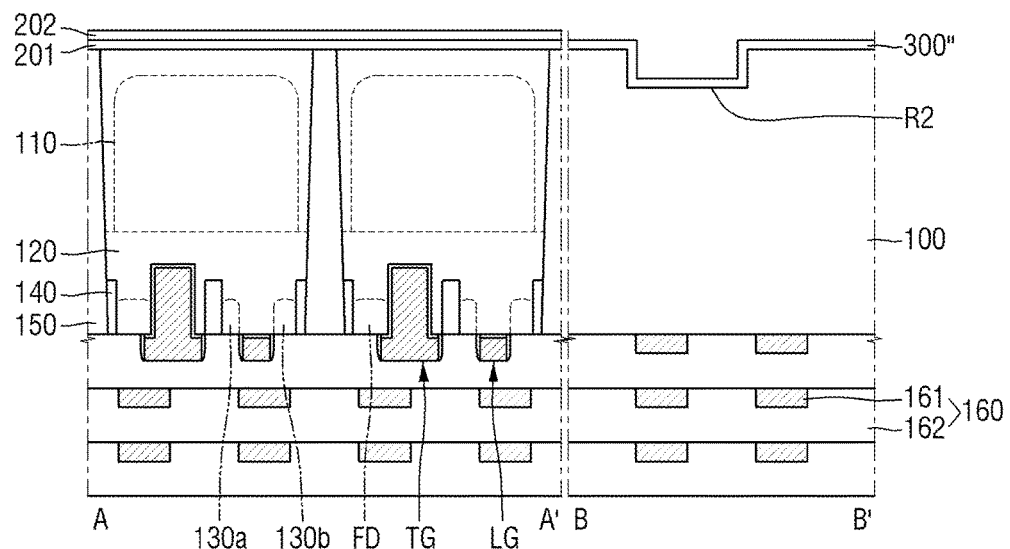

Referring to FIG. 18, a delamination-preventing layer 300" is formed on the substrate 100 in the pad region PAD. The delamination-preventing layer 300" is formed in the same manner as the delamination-preventing layer 300 described above with reference to FIG. 10.

The delamination-preventing layer 300" may also be formed on the bottom surface and side walls of the recess R2. For example, the delamination-preventing layer 300" may be disposed conformally on the substrate 100 in the pad region PAD.

Figure 19:
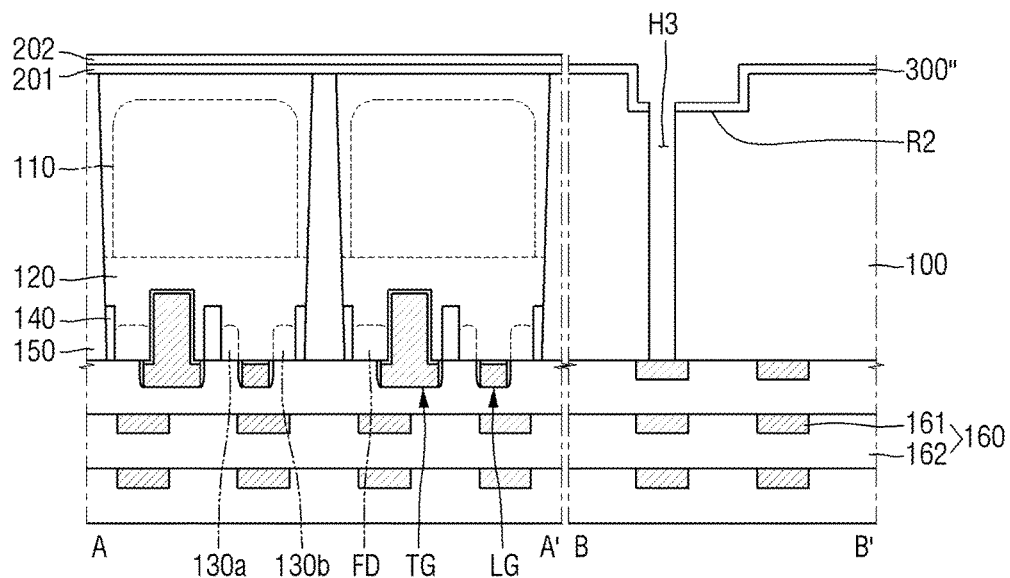

Referring to FIG. 19, a through hole H3 for exposing the first wiring layer 160 is formed in the substrate 100 in the pad region PAD. The through hole H3 is formed in the same manner as the through hole H2 described above with reference to FIG. 15.

Figure 20:
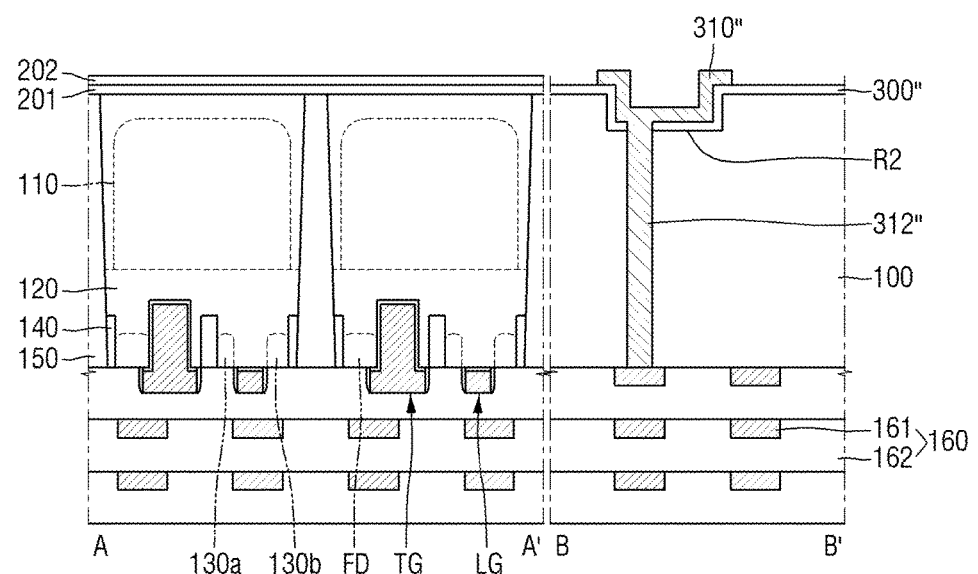

Referring to FIG. 20, a plug 312" with which the through hole H3 is filled, and a second wiring layer 310" connected to the plug 310" and disposed on the substrate 100 are formed. The plug 312" and the second line layer 310" are formed in the same manner as the plug 312' and the second line layer 310' described above with reference to FIG. 16, respectively.

Subsequently, a conductive pad 320" is formed on the second wiring layer 310" to form the image sensor 3 according to FIG. 6.

In the various examples above, the delamination-preventing layer above but closest to the substrate 100 in the pad region PAD where a pad is disposed (e.g., between the pad and the substrate) may be formed of a first material different from a second material that forms the anti-reflecting layer (or subsidiary layer) above but closest to the substrate 100. For example, the first material may have a different refractive index from the second material.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the invention.

What is claimed is:

1. An image sensor comprising:
a substrate comprising a light-receiving region and a pad region disposed around the light-receiving region, wherein the light-receiving region receives light to generate image data;
a photoelectric conversion layer disposed in the light-receiving region of the substrate;
an anti-reflection layer disposed on the photoelectric conversion layer and comprising a plurality of subsidiary anti-reflection layers;
a microlens disposed on the anti-reflection layer;
a delamination-preventing layer disposed in the pad region of the substrate; and
a wiring layer disposed on the delamination-preventing layer,
wherein a lowermost one of the subsidiary anti-reflection layers of the anti-reflection layer includes a first material composition and the delamination-preventing layer includes a second material composition different from the first material composition;
wherein the pad region comprises a recess, and
wherein the wiring layer is disposed directly on the delamination-preventing layer in the recess.

2. The image sensor according to claim 1, wherein an uppermost one of the subsidiary anti-reflection layers of the anti-reflection layer is substantially the same layer as the delamination-preventing layer.

3. The image sensor according to claim 1, wherein an uppermost one of the subsidiary anti-reflection layers of the anti-reflection layer includes a third material composition different from the second material composition of the delamination-preventing layer.

4. The image sensor according to claim 1, wherein a lower surface of the anti-reflection layer and a lower surface of the delamination-preventing layer are disposed in a substantially same plane.

5. The image sensor according to claim 1, further comprising:
a color filter layer interposed between the anti-reflection layer and the microlens.

6. The image sensor according to claim 1, further comprising:
a conductive pad disposed on the wiring layer.

7. The image sensor according to claim 1, further comprising:
a plug, wherein the plug penetrates through the substrate and the delamination-preventing layer of the pad region to be connected to the wiring layer.

8. An image sensor comprising:
a substrate comprising a light-receiving region and a pad region disposed around the light-receiving region, wherein the light-receiving region receives light to generate image data, and the pad region comprises a recess;
a photoelectric conversion layer disposed on the light-receiving region of the substrate;
an anti-reflection layer disposed on the photoelectric conversion layer;
a microlens disposed on the anti-reflection layer;
a delamination-preventing layer disposed on the substrate of the pad region;
a wiring layer disposed on the delamination-preventing layer in the recess; and a conductive pad disposed on the wiring layer and buried in the recess, wherein the anti-reflection layer includes a material composition not included in the delamination-preventing layer;
wherein the anti-reflection layer comprises a plurality of subsidiary anti-reflection layers, and
wherein a lowermost one of the subsidiary anti-reflection layers and the delamination-preventing layer comprise different material compositions.

9. The image sensor according to claim 8, wherein the anti-reflection layer comprises a plurality of subsidiary anti-reflection layers, and
wherein a material composition of an uppermost one of the subsidiary anti-reflection layers is identical to a material composition of the delamination-preventing layer.

10. The image sensor according to claim 8, wherein the anti-reflection layer comprises a plurality of subsidiary anti-reflection layers, and
wherein an uppermost one of the subsidiary anti-reflection layers and the delamination-preventing layer comprise different material compositions.

11. The image sensor according to claim 8, wherein the delamination-preventing layer is disposed conformally on the recess.

12. The image sensor according to claim 8, wherein a lower surface of the anti-reflection layer is positioned higher in a first direction than a position of a lower surface of the delamination-preventing layer on the recess in the first direction.

13. The image sensor according to claim 8, further comprising:
a color filter layer interposed between the anti-reflection layer and the microlens.

14. An image sensor comprising:
a photoelectric conversion layer disposed on a light-receiving region of a substrate, wherein the light-receiving region receives light to generate image data;
an anti-reflection layer disposed on the photoelectric conversion layer;
a microlens disposed on the anti-reflection layer;
a delamination-preventing layer disposed on a pad region of the substrate;
a wiring layer disposed on the delamination-preventing layer; and
a conductive pad disposed on the wiring layer,
wherein the anti-reflection layer includes material composition for preventing reflection of incident light and the delamination-preventing layer includes material composition for preventing delamination of the wiring layer;
wherein the pad region comprises a recess, and
wherein the wiring layer is disposed directly on the delamination-preventing layer in the recess.

15. The image sensor according to claim 14, wherein the anti-reflection layer comprises a first subsidiary anti-reflection layer disposed on the photoelectric conversion layer, and
a second subsidiary anti-reflection layer disposed on the first subsidiary anti-reflection layer.

16. The image sensor according to claim 15, wherein the first subsidiary anti-reflection layer and the delamination-preventing layer comprise different material compositions.

17. The image sensor according to claim 15, wherein the second subsidiary anti-reflection layer and the delamination-preventing layer comprise the same material composition.

18. The image sensor according to claim 15, wherein the first subsidiary anti-reflection layer and the second subsidiary anti-reflection layer are disposed on the pad region of the substrate.

* * * * *